United States Patent [19]

Flachenecker et al.

[11] Patent Number: 4,626,728

[45] Date of Patent: Dec. 2, 1986

[54] POWER GENERATOR FOR A PIEZOELECTRIC ULTRA-SONIC TRANSDUCER

[75] Inventors: Gerhard Flachenecker, Ottobrunn; Karl Fastenmeier, Munich; Heinz Lindenmeier, Planegg, all of Fed. Rep. of Germany

[73] Assignee: MED-Inventio AG, Zurich, Switzerland

[21] Appl. No.: 840,463

[22] Filed: Mar. 12, 1986

Related U.S. Application Data

[63] Continuation of Ser. No. 640,075, Aug. 10, 1984, abandoned.

[30] Foreign Application Priority Data

Sep. 3, 1983 [DE] Fed. Rep. of Germany ....... 3331896

[51] Int. Cl.[4] ........ H01L 41/08

[52] U.S. Cl. ........ 310/316; 318/116

[58] Field of Search ........ 310/316–318, 310/26; 318/116, 118; 239/102

[56] References Cited

U.S. PATENT DOCUMENTS

| | | | |
|---|---|---|---|
| 3,443,130 | 5/1969 | Shoh | 310/316 |
| 4,227,110 | 10/1980 | Douglas et al. | 310/316 |
| 4,271,371 | 6/1981 | Furuichi et al. | 310/316 |
| 4,277,758 | 7/1981 | Mishiro | 310/316 X |
| 4,371,816 | 2/1983 | Wieser | 310/316 X |
| 4,445,063 | 4/1984 | Smith | 310/316 |

*Primary Examiner*—Mark O. Budd

*Attorney, Agent, or Firm*—Donald D. Mon; David O'Reilly

[57] ABSTRACT

A power generator is provided to drive an high power ultrasonic transducer at its resonant frequency even under changing conditions cause by e.g. load fluctuations, aging or heating. The power generator uses a variable-controlled oscillator driving a power amplifier; a three winding transformer has one winding coupled to the transducer, one winding coupled to the output of the power amplifier and the third winding coupled to a phase measuring means. The output of the phase measuring means is fed back to the variable-controlled oscillator.

6 Claims, 3 Drawing Figures

POWER GENERATOR FOR A PIEZOELECTRIC ULTRA-SONIC TRANSDUCER

This is a continuation of co-pending application Ser. No. 640,075, filed Aug. 10, 1984, now abandoned.

FIELD OF THE INVENTION

The present invention relates to a power generator for an ultrasonic transducer.

BACKGROUND OF THE INVENTION

Ultrasonic transducers are used in many cases, where a desired action can be obtained with the power of an ultrasonic wave or vibration. One example is constituted by cleaning equipment, in which a cleaning fluid is excited to ultrasonic vibrations by an ultrasonic transducer enabling firmly adhering impurities and contaminants to be removed from the surface of immersed objects. Another example is provided by ultrasonic welding equipment, in which use is made of the dissipated heat occurring in the case of high intensity ultrasonic vibrations in elastic materials. In electronics engineering, ultrasonic transducers are known e.g. for emitting directed, modulated ultrasonic waves in water, which can be used for intelligence transmission or for the position finding of ships under water. In the medical field, ultrasonic transducers e.g. are used for shattering renal and urinary calculi, because high intensity ultrasonic waves can be relatively easily led by waveguides through natural body openings (e.g. the urethra) to the calculi to be destroyed, so that the latter can be removed without major operations being necessary.

Ultrasonic transducers are termed as electromechanical transducers and can be constructed according to different principles. In the case of high power levels, preference is given to the use of ceramic disks, which operate according to the inverse piezoelectric effect principle.

In operation, ultrasonic transducers are coupled to a mechanical resonance arrangement. However, high power outputs with a good efficiency can only be achieved in all cases, if the arrangement operates precisely at the resonant frequency of the mechanical arrangement, or very close to it. The electrical power supplied to the ultrasonic transducer, must therefore be very accurately supplied with the operating frequency of the mechanical arrangement. However, as the resonant frequency of the arrangement can change in operation, i.e. due to heating, load changes or ageing phenomena during its life, the power generator which controls the ultrasonic transducer must be regulated on the basis of the resonance conditions of the mechanical arrangement. For this purpose use is made of phase measuring devices, which measure the phase difference between the voltage applied to the ultrasonic transducer and the applied current. The output signal of the phase measuring device is used to finely regulate the power generator frequency in such a way that voltage and current at the ultrasonic transducer maintain a predetermined phase displacement, i.e. are generally as far as possible in phase.

A known arrangement of this type is described in "The High-Frequency Generator for the Ultrasonic Lithrotrite", IN-SIGHT, Urology Edition April 1983, published by Karl Storz Endoscopy-America Inc., Culver City, CA/USA. This is in fact a high frequency power generator, which supplies an ultrasonic probe for the shattering of urinary calculi. The high frequency generator contains a voltage-controlled oscillator or VCO, which can be frequency-tuned with an applied voltage. The high frequency output voltage of the oscillator is amplified by a power amplifier and supplied to the ultrasonic transducer. At the output of the amplifier, a phase measuring device measures the phase difference between the current flowing through the ultrasonic transducer and the voltage applied to the ultrasonic transducer and transfers the output signal to the VCO, so that the frequency of the latter is continuously finely tuned to the resonant condition.

However, this method does not operate in an optimum manner. It is known from the use of the described power generator, that the oscillation or vibration of the ultrasonic transducer sometimes "breaks off", i.e. despite the resonance regulation, the VCO operates at a completely incorrect frequency and the ultrasonic transducer no longer supplies any power. This behaviour is particularly observed if there is a fluctuation in the ultrasonic transducer loading, e.g. if the operating surgeon presses the probe connected to the transducer too strongly against a urinary calculus to be destroyed. It is also known from the production process of the described power generator, that it is not possible during the final phase regulation to set a zero phase displacement between the ultrasonic transducer current and voltage, although this would appear to be the optimum solution. When setting the phase displacement, which constantly regulates the power generator in operation, it is often necessary on each occasion to find a compromise between the maximum power output and the stability of the output power. However, it is never possible to simultaneously achieve a maximum possible power and absolute stability of the vibration against load fluctuations.

There are a number of causes for this. Firstly an ultrasonic transducer has an equivalent circuit diagram, as a series resonance circuit is built up from a capacitor, an inductance coil and an ohmic resistor. A capacitor, namely the so-called rest capacitor of the ultrasonic transducer is in parallel with this series resonance circuit. The value of the ohmic resistor in the series resonance circuit changes with varying loading, being smallest with the smallest loading and rising as the load rises.

Furthermore, the ultrasonic transducer is spatially separated from the power generator, e.g in the case of ultrasonic urinary calculus shattering. The spacing must be bridged by a lead, whose capacitance gives a further parallel capacitance to the ultrasonic transducer. Thus, the electrical impedance of the complete ultrasonic transducer including lead connected to the power generator no longer has the phase angle zero at the actual resonance of the mechanical arrangement. At the resonant frequency of the mechanical arrangement, the phase angle of the electrical impedance does not even have a constant value if the load changes. Thus, a fixed setting of the phase regulation can at the best give the optimum power output for a single loading value. For any other loading, the VCO phase regulation influences it in such a way that to a greater or lesser extent the frequency differs from the resonance of the mechanical arrangement.

The locus of the input impedance of an ultrasonic transducer with rest capacitance and lead capacitance is not symmetrical to the real axis in the resonant frequency range. The greater the loading the more asymmetrical it becomes and can migrate to such an extent in the capacitive half-plane that there is no value at all in the vicinity of the resonant loop at which the phase between the current and the voltage has the value to which the phase regulation is set. With such a loading, the vibration or oscillation breaks off and the ultrasonic transducer no longer supplies any power.

SUMMARY SOLVED BY THE INVENTION

The problem of the invention is to provide a power generator for an ultrasonic transducer, in which the phase regulation can be set in such a way that the maximum possible power output of the power generator and the maximum possible vibration stability during load fluctuations are simultaneously achieved.

According to the invention, the second input signal of the phase measuring device with which the phase of the current is measured by the ultrasonic transducer is derived from a three-winding transformer. All the current supplied to the ultransonic transducer, or a proportion thereof, flows through the first transformer winding. A current equal to or proportional to the reactive current caused by the rest capacitance and lead capacitance of the ultrasonic transducer flows through the second transformer winding. The first and second windings are poled in such a way that their magnetic effects on the transformer core are subtracted from one another. A magnetic voltage proportional to the pure active current flowing through the active resistor in the equivalent circuit diagram of the ultrasonic transducer acts on the core. Thus, a signal can be taken from the third transformer winding, which is proportional to the pure active current of the ultrasonic transducer and in particular has the phase thereof. If this signal is supplied to the phase measuring device as a phase signal for the ultrasonic transducer current, then resonant monitoring can take place without the disturbing influences of the lead inductance and the rest capacitance of the ultrasonic transducer. The phase between the voltage at the ultrasonic transducer and its active current can be made constant and in fact precisely zero degrees, without taking account of the loading.

According to an advantageous development of the invention, the first transformer winding is connected in series with the connected ultrasonic transducer. A capacitor is connected in series with the second transformer winding. The two resulting series connections are connected in parallel and directly, or via known coupling circuits, to the power amplifier output. Capacitor in series with the second winding is dimensioned in such a way that the ratio of its capacitance to the sum of the lead capacitance and the rest capacitance of the ultrasonic transducer is approximately reciprocally proportional to the ratio of the number of turns of the first and second windings. The effects of the lead and rest capacitance almost completely compensate one another in frequency-independent manner for the phase measurement in the core of the transformer in the case of such dimensioning.

If the capacitor capacitance is approximately of the same magnitude of the sum of the lead capacitance and the rest capacitance of the ultrasonic transducer and if the first and second transformer windings have the same number of turns, a further advantageous development of the invention is obtained.

Further advantageous developments of the invention are proposed. In order to obtain an optimum low-loss connection of the ultrasonic transducer to the power generator, the inductance of the first transformer winding must be kept as small as possible. This can best be achieved if a very low-scatter construction of the core is used for the transformer. It is possible in this case to work with very small numbers of turns and consequently very small inductance values. According to the invention, a ring core is proposed for the transformer. This makes it possible to only have a single turn for the first and second windings. For the first and second windings in the case of a ring core, this means in each case one line passed through each ring core.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
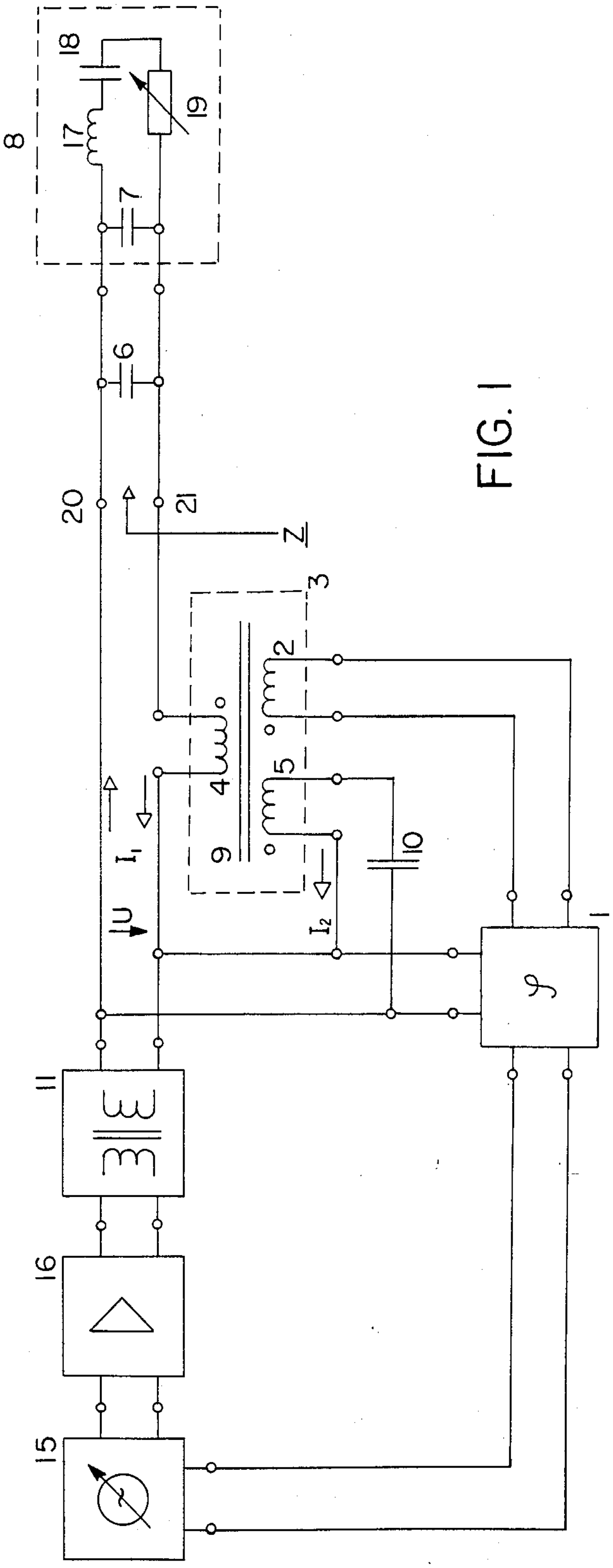
FIG. 1 a block circuit diagram of a power generator according to the invention with a three-winding transformer and the equivalent circuit diagram of a connected ultrasonic transducer with a lead capacitance.

FIG. 1 shows a block circuit diagram of a power generator according to the invention with the three-winding transformer. VCO 15 supplies a power amplifier 16, to whose output is connected in the present case a coupling quadripole 11. The latter can be used in known manner, if e.g. the amplifier operates on the basis of the push-pull principle and the outputs of the two amplifier halves are interconnected. However, it can also be used for power matching purposes. Generally such a coupling quadripole is constructed as a transformer with a high coupling factor. The series connection of the ultrasonic transducer 8 and the first winding 4 of transformer 3 connected to the output of the possibly used quadripole. The lead capacitor 6 is connected in parallel to the ultrasonic transducer 8.

The series connection of the second winding 5 of the transformer 3 and the capacitor 10 is connected to the output of the coupling quadripole 11. At the output of coupling quadripole 11, voltage U is tapped as the first input signal for the phase measuring device 1. There is a third winding 2 on core 9 of transformer 3, and from it is tapped the second input signal for phase measuring device 1.

Phase measuring device 1 can operate according to any one of the known principle. It is merely necessary for it to have a suitable connection between its output voltage and the phase difference between the two input signals. The phase measuring device generally contains a desired value comparator and a variable gain amplifier with a suitable characteristic, so that the control loop operates in a stable manner and the phase difference between the two input signals of the phase measuring device is constantly regulated to the given desired value.

Figure 2:
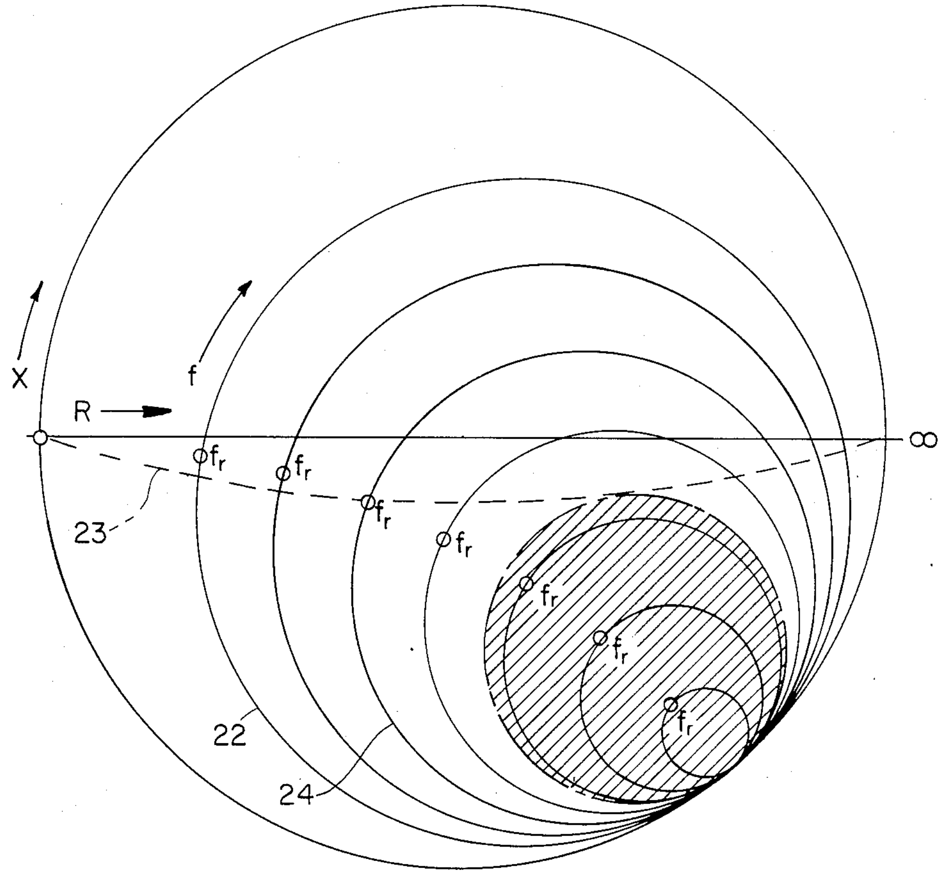
FIG. 2 loci of the input impedance of an ultrasonic transducer for different loading values and whilst taking account of the lead and rest capacitance.

In a Smith chart, FIG. 2 shows the loci of input impedence Z of an ultrasonic transducer with a lead in the resonant frequency range, as would be measured e.g. between terminals 20 and 21 of FIG. 1. The locus parameter is the loading. The locus 22 with the largest diameter describes the unloaded case. The real parts of the impedence contained in this locus are only due to the internal losses of the ultrasonic transducer and the coupled mechanical resonance arrangement. The smaller diameter loci occur with increasing loading of the ultrasonic transducer.

The resonant frequency fr of the mechanical resonance is marked with a circle on each locus. The power generator must always supply its power at this frequency in order to be able to produce the maximum possible ultrasonic power during each loading. However, as can be gathered from FIG. 2, the electrical input impedence of the ultrasonic transducer has a different phase angle at the mechanical resonant frequency during each loading operation. Thus, if the phase regulation of a power generator is set to a constant phase angle between voltage and current in the ultrasonic transducer without using the means according to the invention, this setting can only give the maximum possible ultrasonic power during one loading operation. This is shown for an example in FIG. 2. The broken line curve 23 in the Smith chart is a constant impedance phase curve. If the phase regulation is set to the value of this example, then the ultrasonic transducer is only operated in the third represented loading case with locus 24 under mechanical resonance, but not under all other loading conditions.

FIG. 2 also shows that as from a given loading, the loci of the input impedance Z no longer intersect the set phase angle. In this loading range, shown in hatched manner in FIG. 2, no further power is supplied by the power generator without the means according to the invention, so that the ultrasonic vibration breaks off. Thus, such a generator can only be set to a compromise between efficiency at a given loading and stability.

However, the power generator according to the invention obviates the effects of the lead capacitance and rest capacitance of the ultrasonic transducer, because the reactive currents linked therewith are compensated in the measuring branch of the current phase with the aid of the proposed measure. A generator with the features of the invention can be set in optimum manner to the mechanical resonance of the ultrasonic transducer and this setting is maintained during each loading operation. Moreover, there is no break-off of the ultrasonic oscillation with the optimum power setting.

Figure 3:
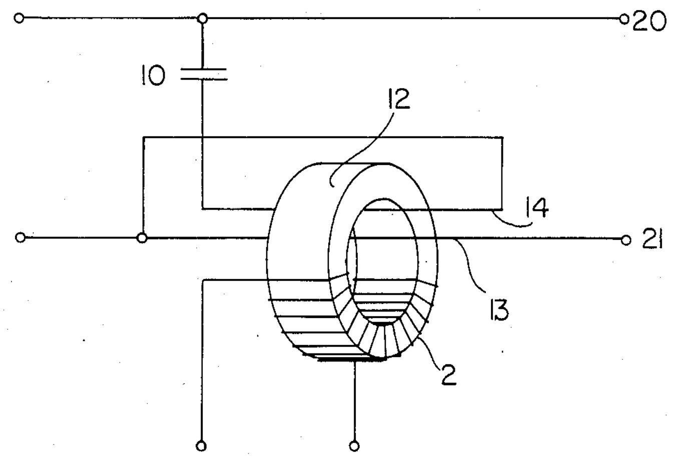
FIG. 3 an embodiment of a three-winding transformer, whose core is constructed as a ring core.

FIG. 3 shows a particularly advantageous embodiment of a three-winding transformer according to the invention. In this embodiment, the transformer core is constructed as a ring core, which has a particularly low scatter and consequently makes it possible to have small inductances for the first and second windings. In this case, both the first and the second windings are in the form of a single turn, which means in the case of a ring core a single line passed in each case through said core.

What is claimed is:

1. A power generator for an ultrasonic transducer comprising variable-controlled oscillator means;

power amplifier means receiving the output of said variable-controlled oscillator means;

a transformer having three windings, said transformer having a first winding connected to said ultrasonic transducer;

coupling means coupling the output of said power amplifier means and said variable controlled oscillator means to said ultrasonic transducer through said first winding of said transformer;

phase measuring means having first and second inputs and an output, said first input being derived from the output of said coupling means, said second input being derived from the load current flowing through said ultrasonic transducer and said first winding by connecting said second input to a third winding of said three windings transformer, said second input being a current porportional to a reactive current component of said load current flowing in a second winding of said three winding transformer caused by the lead capacitance and rest capacitance of said ultra-sonic transducer, said second winding being connected to the output of said coupling means, said first and second windings being poled so that their magnetic effects are subtracted from each other;

said phase measuring device producing an output to said variable controlled oscillator proportional to the phase difference of said first and second inputs to adjust the frequency of said variable controlled oscillator means to a resonant frequency of said ultrasonic transducer determined by the load applied to said transducer.

2. A power generator for an ultrasonic transducer according to claim 1 wherein said first transformer winding is connected in series with said ultrasonic transducer; said second transformer winding being connected in series with a capacitor; said first transformer winding series connection and second transformer winding series connection being connected in parallel to the output of said power amplifier; said series connected capacitor having a value such that the ratio of its capacitance to the sum of said lead capacitance and rest capacitance of said ultransonic transducer is approximately reciprocally proportional to the ratio of turns of said first and second transformer windings.

3. A power generator for an ultrasonic transducer according to claim 2, wherein the capacitance of said series capacitor is approximately equal to the sum of said lead capacitance and rest capacitance of said ultrasonic transducer and the number of turns of said first and second windings of said three winding transformer are equal.

4. A power generator for an ultrasonic transducer according to claim 9 wherein said three winding transformer has a ring core.

5. A power generator for an ultrasonic transducer according to claims 3 or 4, wherein said first and second windings of said three winding transformer are formed by a single turn respectively.

6. A power generator for an ultrasonic transducer according to claim 4, wherein said first and second windings of said three winding transformer each comprise a wire passed through said ring core.

* * * * *